US006093610A

United States Patent [19]

Rodder

[11] Patent Number: 6,093,610

[45] Date of Patent: Jul. 25, 2000

[54] SELF-ALIGNED POCKET PROCESS FOR DEEP SUB-0.1 μM CMOS DEVICES AND THE DEVICE

[75] Inventor: Mark S. Rodder, University Park, Tex.

[73] Assignee: Texas Instruments Incorporated, Dallas, Tex.

[21] Appl. No.: 09/094,978

[22] Filed: Jun. 16, 1998

Related U.S. Application Data

[60] Provisional application No. 60/050,112, Jun. 18, 1997.

[51] Int. Cl.[7] .................... H01L 21/336

[52] U.S. Cl. .................... 438/289; 438/305; 438/563; 438/564; 438/596

[58] Field of Search .................... 438/289, 563, 438/564, 304, 305, 306, 307, 596

[56] References Cited

U.S. PATENT DOCUMENTS

| | | | |
|---|---|---|---|
| 4,488,351 | 12/1984 | Momose | 438/304 |
| 5,013,675 | 5/1991 | Shen et al. | 438/305 |
| 5,179,034 | 1/1993 | Mori et al. | 438/273 |
| 5,498,555 | 3/1996 | Lin | 438/304 |
| 5,504,024 | 4/1996 | Hsu | 438/305 |
| 5,527,721 | 6/1996 | Farb | 438/289 |
| 5,629,556 | 5/1997 | Johnson | 257/588 |
| 5,710,054 | 1/1998 | Gardner et al. | 438/304 |
| 5,759,885 | 6/1998 | Son | 438/307 |
| 5,770,508 | 6/1998 | Yeh et al. | 438/305 |
| 5,851,866 | 12/1998 | Son | 438/231 |

OTHER PUBLICATIONS

"Sub–50 NM Gate Length N–MOSFETS with 10 NM Phosphorus Source and Drain Junctions", Ono et al., 1993 IEEE, pp. 119–122.

*Primary Examiner*—Michael Trinh

*Attorney, Agent, or Firm*—Jacqueline J. Garner; W. James Brady, III; Frederick J. Telecky, Jr.

[57] ABSTRACT

A self-aligned pocket process for formation of CMOS devices and the devices by means of a sidewall doped overlayer to achieve deep sub-0.1 μm CMOS with reduced gate length variation. The localized pocket results in reduced $C_J$. The method includes providing a semiconductor substrate and forming a gate electrode over the substrate separated from the substrate by an electrical insulator. A preferably electrically insulating sidewall material which contains a dopant of predetermined conductivity type is formed over and either in contact with or spaced from the sidewalls of the gate electrode. The dopant is caused to migrate into the substrate beneath the sidewall material with some lateral movement to form a pocket of the predetermined conductivity type in the substrate. A further sidewall can be added to the sidewall material after pocket formation. The sidewall material can be later removed. Drain extensions and/or source/drain regions are formed in the substrate of conductivity type opposite the predetermined conductivity type, with or without use of sidewalls as a mask to provide minimal overlap between the drain extensions and/or source/drain regions and the pocket.

4 Claims, 2 Drawing Sheets

SELF-ALIGNED POCKET PROCESS FOR DEEP SUB-0.1 μM CMOS DEVICES AND THE DEVICE

This application claims priority under 35 USC 119(e)(1) of provisional application number 60/050,112 filed Jun. 18, 1997.

BACKGROUND OF THE INVENTION

1. Field of the Invention

This invention relates to a process for formation of a self-aligned pocket in the fabrication of MOS devices and the MOS devices.

2. Brief Description of the Prior Art

A development in the fabrication of MOS semiconductor devices has included the pocket process. The pocket process is a process whereby a region of dopants opposite to the type used for source/drain (and/or drain extension) regions is formed adjacent to the source/drain (and/or drain extension regions), referred to herein as a "pocket region". The lateral extent of the pocket region is less than the channel length of the MOSFET such that the formation of the pocket results in a laterally non-uniform dopant region from the source and/or drain and/or drain extension to the interior of the channel region. The pocket regions are typically formed by implantation over an entire moat (or active area) region such that for MOSFETs with shallow junction depth, a large junction capacitance (Cj) can arise from the pocket process. The benefits of this dopant profile are reduced short-channel effects (i.e., reduced threshold-voltage rolloff) and reduced variation of drive current with variation in gate length.

For shallow junction CMOS, the pocket dopants may also extend to a vertical depth greater than the drain extension region (and/or shallow source/drain region), thus creating a high bottomwall capacitance between the pocket region and a shallow source/drain region. While a deeper source/drain region to a depth greater than the pocket region can be formed to reduce the bottomwall capacitance, such a deep source/drain junction is not scalable to ultra-high-density MOSFET technology since such a deep source/drain junction would result in undesirable short-channel effects as the spacer separation of the gate electrode to the edge of the deep source/drain region is decreased in ultra-high-density MOSFET technology.

An example of such a prior art device is shown in FIGS. 1*a* and 1*b* wherein there is shown a semiconductor substrate 1, for example doped p-type, having a gate electrode 3 spaced from the substrate by a dielectric layer 5. Shallow doped extension regions 7 (denoted herein as drain extension regions and, for example, doped n-type) may be formed on each side of the gate electrode 3 with or without sidewall dielectric spacers 12 (sidewall spacers 12 shown in FIG. 1*b*) provided adjacent to the gate electrode 3 prior to formation of the doped extension regions 7. Pocket regions 9 of doping type opposite (e.g., p-type) to that of the drain extension regions 7 may be formed by means of implantation prior to or after formation of the drain extension regions 7. Typically, the pocket region 9 extends beyond the drain extension regions 7 in both the lateral and vertical directions, whereby a large bottomwall capacitance can result due to the n/p junction region formed at the bottom of the drain extension region due to the overlap with the pocket region 9 over the entire active area. The doping in the pocket region 9 from the pocket process may be of higher concentration than the doping of the substrate 1.

To reduce this bottomwall capacitance over the entire active area, a deeper source/drain region 10 (in this example, n-type) can be formed after formation of sidewall spacers 12 so that the bottomwall overlap of the deeper source/drain region 10 and the pocket regions 9 is eliminated, thus reducing the bottomwall capacitance in these regions as shown in FIG. 1*b*. Nonetheless, the bottomwall capacitance arising from the overlap of the remaining length of the drain extension region 7 and the underlying pocket doping 9 still remains. As noted above, while a deeper source/drain region 10 to a depth greater than the pocket region 9 can be formed to reduce the bottomwall capacitance, a further problem exists in that such a deep source/drain junction is not scalable to ultra-high-density MOSFET technology wherein such a deep source/drain junction would result in undesirable short-channel effects as the spacer separation of the gate electrode 3 to the edge of the deep source/drain region is decreased in ultra-high-density MOSFET technology.

In addition, a doped diffusion source has been known and used in the prior art for the purpose of forming the shallow drain extension regions 7 having a conductivity type the same as the deep source-drain regions 10.

It is desired that there be provided a self-aligned pocket doping process with low junction capacitance, Cj, and without the need for the deeper source/drain region to achieve the low Cj (bottomwall) in the active region.

SUMMARY OF THE INVENTION

In accordance with the present invention, the above noted problems of the prior art are minimized and there is provided a process which accomplishes the above noted desired results.

It is initially noted that a doped diffusion source is not known to have been used in the prior art to form a pocket region of doping opposite to that of a shallow drain extensions and deep source/drain regions. Additionally, a doped diffusion source is not known to have been utilized for the purpose to be explained hereinbelow with regard to minimizing junction capacitance associated with the formation of a pocket region of doping opposite to that of a shallow drain extension region. It is noted that minimization of the junction capacitance associated with the pocket region is provided by having the lateral extent of the doped diffusion source small. By contrast, for formation of a shallow drain extension from a doped diffusion source, it is desired that the diffusion source extend to a larger lateral extent adjacent to the gate electrode so that the formed shallow drain extension will properly connect electrically to a deep source/drain region with the latter region spaced from the gate electrode by a desired spacer thickness.

The above noted desired result is accomplished by providing a novel method to achieve low Cj with a self-aligned pocket doping process. This process can be utilized for conventional CMOS fabrication sequences or for a disposable gate CMOS structure or for any semiconductor structure for which a pocket doping is desired to obtain the benefits of pocket doping, but with reduced capacitance. It should be understood that though the invention is discussed with reference to NMOS devices, it also applies to PMOS devices which are provided by a reversal of the conductivity types of all of the regions discussed as well as to other devices as discussed hereinbelow.

Briefly, the above is accomplished by providing a doped sidewall material adjacent to or near the vertical edges of the gate electrode of a partially fabricated MOSFET for which out-diffusion from the self-aligned doped sidewall material is utilized to form a pocket region in the substrate of desired lateral and vertical extent. A thin undoped insulator may be present under the doped sidewall material if desired. The sidewall material can be formed from an insulating material such as a doped oxide or can be formed from a non-insulating material such as a doped semiconductor material. The sidewall material may be removable and removed, if desired, after completion of the process of diffusing dopants from the doped sidewall material to form the doped pocket region in the substrate. Examples of doped oxides may include borosilicate glass (BSG) or phosphosilicate glass (PSG). Examples of doped semiconductor material may be non-crystalline silicon (Si) or non-crystalline silicon germanium (SiGe). The doped sidewall material has a thickness from about 50 Angstroms (Å) to about 500 Å and preferably about 200 Å, these being dimensions of the order which cannot be reliably obtained and reproduced using a resist masking process with resist (e.g. being used to mask a subsequent implant) to form a pocket region of desired limited lateral extent. The sidewall material is doped of opposite dopant type to that of the shallow drain extension regions (if present) and to that of the source/drain regions to be formed. In the case of an NMOS device, the sidewall material is doped substantially p-type and in the case of a PMOS device, the sidewall material is doped substantially n-type.

The sidewall is formed by first conformally depositing a layer of the desired material over the substrate over which the gate electrode has previously been formed. If the material is deposited substantially doped by means of in-situ doping deposition processes, the material may then be etched in a standard manner to form a sidewall of doped material substantially adjacent to the vertical edges of the gate electrode. If the material is deposited such that additional doping is required prior to sidewall formation, the material may be further doped by means of standard doping processes, such as implantation at a desired low energy. Subsequently, the newly doped material may be etched to form a sidewall of material substantially adjacent to the vertical edges of the gate electrode. It is essential that the sidewall material be doped with opposite dopant type (or conductivity type) to that of the source/drain and/or drain extension regions. It is noted that if drain extension regions are desired, the drain extension regions may be formed prior to or after the formation of the doped sidewall material with the drain extension regions formed by means including implantation. At this point in the fabrication process, the MOSFET may be subjected to an annealing step whereupon some of the dopants from the doped sidewall material diffuses into the substrate to form a pocket region in the substrate. This annealing step can be performed at a later point in the MOSFET fabrication process by being combined with the anneal of the source/drain dopants, if desired. The pocket region in the substrate formed by such out-diffusion now extends substantially only beneath the sidewall and with sufficient lateral and vertical extent to form the desired length and depth of the pocket region beyond the tip of the drain extension regions. The lateral extent of the pocket doping beyond the edges of the doped sidewall material may typically be from 0 to about 1000 Å which is substantially less than could be achieved by a resist masking process and subsequent pocket formation by implantation. This limited lateral extent of the pocket thus results in a decrease in junction capacitance as compared with the prior art. The location of the pocket region is easily and tightly controlled since the lateral dimesions of the doped spacer material determines substantially the pocket dimensions.

After formation of the doped sidewall and other process steps as described above, a source/drain region can be formed spaced by a desired thickness from the edge of the gate electrode. This source/drain region can be formed, for example, by implant or epitaxy plus implantation. If the source/drain region should be spaced away from the gate electrode by a distance greater than the width of the doped sidewall spacer, an additional insulating material can be deposited and etched to form an additional sidewall adjacent to the doped sidewall region prior to formation of the source/drain region. It is noted that if the doped sidewall spacer has been removed after out-diffusion of dopants from the doped sidewall spacer into the substrate, then the additional spacer prior to source/drain formation will be substantially adjacent to the gate electrode and not to a doped sidewall spacer.

DESCRIPTION OF THE PREFERRED EMBODIMENTS

The invention will now be described in conjunction with an NMOS transistor. It will be apparent to those skilled in the art that the benefits of this invention can be utilized in connection with other types of transistors, such as, for example, PMOS transistors or other transistors with alternative formation methods of source/drain regions including raised source/drain and outdiffusion of source/drain regions from metals.

Figure 1A:
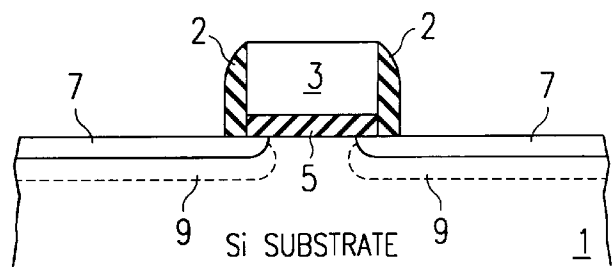
FIGS. 1*a* and 1*b* are cross sectional views of NMOS transistors with a pocket region as formed in accordance with prior art techniques.
Figure 1B:
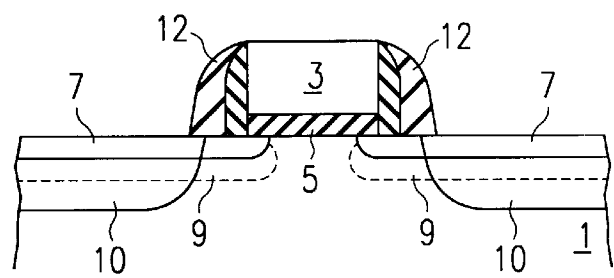
Figure 2A:
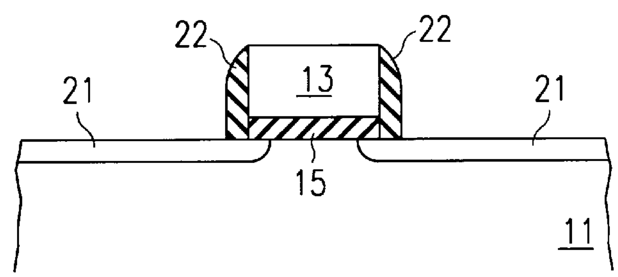
FIGS. 2*a* to 2*c* represent a partial process flow in accordance with a first embodiment in accordance with the present invention.

Referring first to FIG. 2*a*, there is shown a first embodiment in accordance with the present invention which includes a partially fabricated NMOS transistor. For fabrication of the NMOS device, the substrate 11 is p-type. A gate electrode structure is formed in a standard manner depositing or thermally growing a layer of insulator, such as silicon dioxide over the surface of the substrate, depositing a layer of gate material such as non-crystalline semiconductor (such as silicon), masking and doping the gate with dopants, if desired, annealing the gate dopants and masking and etching the gate material resulting in the gate electrode 13 insulated from the substrate 11 by the layer of dielectric 15. A thin sidewall dielectric of thickness typically less than 60 Å may then be grown on the substrate 11 and on the sidewalls of the gate electrode 13. Additional spacer formation with oxide or nitride can be formed substantially adjacent to the gate electrode 13, if desired. The thin sidewall dielectric with or without the additional spacer is shown as sidewall 22. This is followed by implantation of the drain extension implant regions 21 using a species such as arsenic (As) to a peak concentration to a value typically greater than $1\times10^{19}$ $cm^{-3}$. The dopants diffuse through the substrate and through a region of opposed doping type.

Figure 2B:
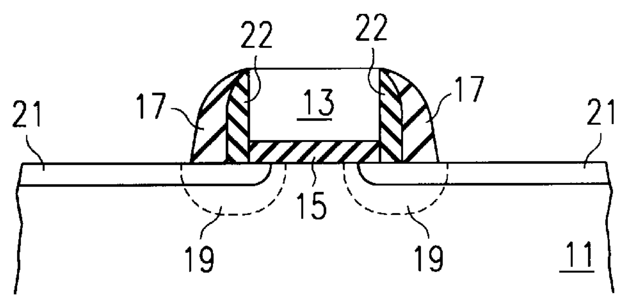
Figure 2C:
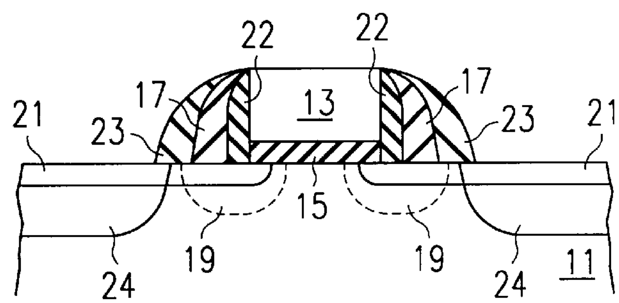

Next, with reference to FIG. 2*b*, a layer of doped insulator material, such as borosilicate glass (BSG) 17 doped p-type is deposited and etched to form a sidewall substantially adjacent to the gate electrode 13 (over the sidewall 22, if present). A selective removal of interfacial material such as oxide may be performed prior to deposition of the doped insulator material 17. The length of the sidewall region may be typically from about 50 to about 1000 Å, depending upon the desired device structure. The dopants from the doped sidewall 17 may then be diffused out into the substrate by annealing by means of rapid-thermal annealing from temperatures ranging from about 900 to about 1100° C. and with times from about 5 to about 60 seconds. Other annealing processes including furnace annealing can be utilized to achieve the desired dopant distribution in the substrate region. Alternatively, this annealing step may be combined with the later source/drain annealing step, if desired. Additionally, it is noted that the drain extension implant may be performed after the formation of the doped insulator material, if desired. The result of this annealing step is shown in FIG. 2*b* with formation of the pocket region 19.

Next, a dielectric 23 comprised of an insulating material such as oxide or a composite dielectric of oxide/nitride can be deposited and etched to form an additional sidewall 23 adjacent to the doped sidewall 17 and prior to source/drain formation. Source/drain regions 24 may then be formed by means of implantation and anneal or by means of epitaxial deposition of silicon followed by implantation and anneal or by means of selective metal or silicide formation followed by implantation and anneal.

Figure 3A:
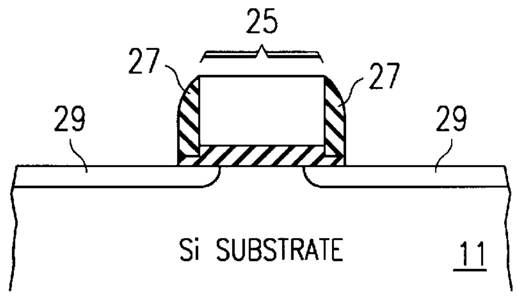
FIGS. 3*a* to 3*c* represent a partial process flow in accordance with a second embodiment in accordance with the present invention.

A method for forming the NMOS transistor according to a second embodiment will now be described. Referring to FIG. 3 there is shown a partially fabricated NMOS disposable gate transistor. For fabrication of the NMOS device, the substrate 11 is p-type. A composite layer 25 of oxide/nitride or oxide/semiconductor (e.g. non-crystalline silicon) is deposited and etched to form a disposable gate structure stack. At this point, if desired, a thin dielectric (e.g., nitride) sidewall 27 of thickness typically less than 200 Å can be formed adjacent to stack 25, if desired, followed by implantation of the drain extension implant regions 29 using a species such as arsenic and to a peak concentration to a value typically greater than $1\times10^{19}$ cm$^{-3}$ as shown in FIG. 3*a*. The drain extension can be formed before or after the pocket formation, if desired.

Figure 3B:
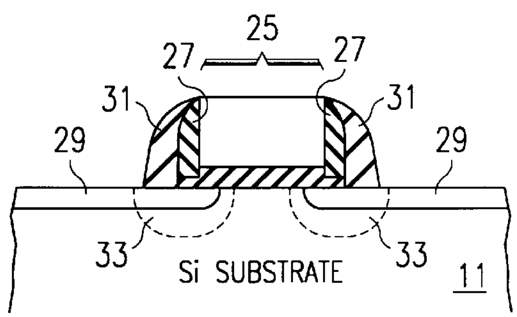

Next, a layer of doped insulator material 31, such as borosilicate glass (BSG) doped p-type which is deposited and etched to form a sidewall substantially adjacent to the disposable gate electrode 25 (or adjacent to sidewall 27, if present) as shown in FIG. 3*b*. The length of the sidewall region may be typically from about 50 to about 1000 Å, depending upon the desired device structure. The dopants from the doped sidewall may then be diffused out into the substrate by annealing by means of rapid-thermal annealing from temperatures ranging from about 900 to about 1100° C. and with times from about 5 to about 60 seconds to form the pocket 33 as shown in FIG. 3*b*. Other annealing processes including furnace annealing can be utilized to achieve the desired dopant distribution in the substrate region. Alternatively, this annealing step may be combined with the later source/drain annealing step, if desired.

Figure 3C:
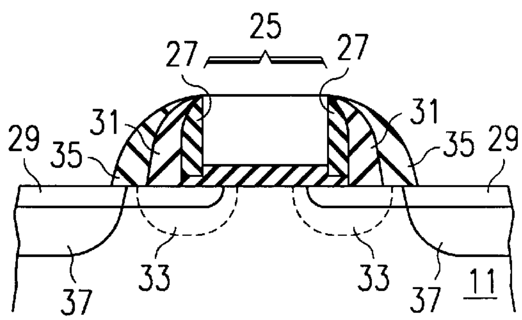

Next, a dielectric comprised of an insulating material 35, such as oxide or a composite dielectric of oxide/nitride can be deposited and etched to form an additional sidewall adjacent to the doped sidewall 31 and prior to source/drain formation. Source/drain regions 37 may then be formed by means of implantation and anneal or by means of epitaxial deposition of silicon followed by implantation and anneal or by means of selective metal or silicide formation followed by impantation and anneal as shown in FIG. 3*c*.

At this point, the gate structure 25, if removable, can be removed in accordance with the procedures set forth in provisional application Ser. No. 60/029,215, filed Oct. 28, 1996 (TI-22027) or Ser. No. 60/029,643, filed Oct. 28,1996 (TI-22748), the contents of each of which are incorporated herein by reference, and a process of formation of a gate electrode over the structure can proceed. After source/drain formation, all additional steps are similar to those set forth in the above noted applications.

Figure 4A:
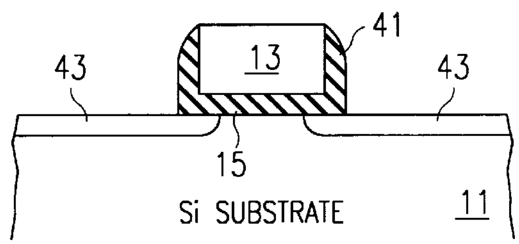
FIG. 4 represents a partial process flow in accordance with a third embodiment in accordance with the present invention.

A method for forming the NMOS transistor will now be described in accordance with a third embodiment of the present invention. Referring to FIG. 4*a*, there is shown a partially fabricated NMOS transistor having a p-type substrate 11. A gate electrode structure is formed in standard manner by depositing or thermally growing a layer of insulator, such as silicon dioxide, over the surface of substrate 11, depositing a layer of gate material such as non-crystalline semiconductor (such as silicon), masking and doping the gate with dopants, if desired, annealing the gate dopants and masking and etching the gate material, resulting in the gate electrode 13 insulated form substrate 11 by the layer of dielectric 15. A thin sidewall dielectric of thickness typically less than 60 Å may then be grown on the substrate 11 and on the sidewalls of the gate electrode 13. Additional spacer formation with oxide or nitride can be formed substantially adjacent to the gate electrode 13, if desired. The thin sidewall dielectric with or without the additional spacer is shown as sidewall 41. This is followed by implantation of the drain extension implant regions 43 using a species such as arsenic and to a peak concetration to a value typically greater than $1\times10^{19}$ cm$^{-3}$. At this point the structure is the same as in the first embodiment described above.

Figure 4B:
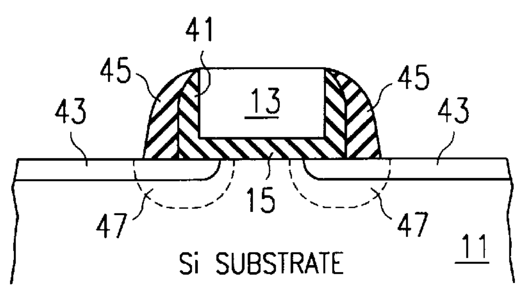
Figure 4C:
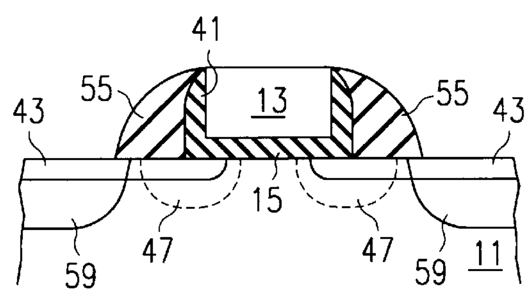

Next, the dielectric 41, still shown in FIG. 4*b*, may be removed, if desired, and a layer of semiconductor material 45 such as SiGe is deposited either in-situ doped or substantially updoped. For the condition in which the material is deposited in-situ doped, the material is then etched substantially anisotropically to form a sidewall adjacent to the gate electrode 13. If the material is deposited substantially undoped, then a doping process such as implantation at a desired implant angle is provided to dope the deposited semiconductor material. At this point, the material is then etched substantially anisotropically to form a sidewall 45 adjacent to the gate electrode 13 as shown in FIG. 4*b*. The length of the sidewall region may be typically from 50 to 500 Å, depending upon the desired device structure. The dopants from the doped sidewall may then be diffused out into the substrate by annealing by means of rapid-thermal annealing at temperatures ranging from 900 to 1100° C. and with times from 5 to 60 seconds to form the pocket 47. Other annealing processes including furnace annealing can be utilized to achieve the desired dopant distribution in the substrate region. Alternatively, this annealing step may be combined with the later source/drain annealing step. At this point, the doped sidewall material 45 may be removed, if desired, by means of selective etching as is established in the prior art and replaced by an electrically insulating sidewall 55 as shown in FIG. 4*c*. Subsequently, the conventional steps of fabrication of an MOS structure can ensue as have been described in prior embodiments hereinabove to provide deep source/drain regions 59.

A fourth embodiment of the invention, which is not shown as such, involves a structure which is the result of combining of the disposable gate process and disposable sidewall process as described above and requires, this embodiment requiring no further explanation.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claim is:

1. A method of fabricating an integrated circuit, comprising the steps of:

providing a semiconductor substrate;

forming a gate structure having a sidewall over said substrate;

forming a first sidewall spacer adjacent said sidewall;

forming drain extension regions of a first conductivity type in said substrate using said first sidewall spacer as a mask;

forming a region of second conductivity type in said substrate extending under said gate structure by:

forming a second sidewall spacer adjacent said first sidewall spacer which contains a dopant of said second conductivity type; and causing said dopant to migrate from said second sidewall spacer to said substrate;

then, forming a third sidewall spacer; and forming source/drain regions in said substrate using said third spacer as a mask.

2. The method of claim 1, further comprising the step of removing said second sidewall spacer prior to forming said third sidewall spacer.

3. The method of claim 1 wherein said second sidewall spacer is one of a doped electrical insulator and a doped semiconductor material.

4. The method of claim 1 wherein said second sidewall spacer is taken from the class consisting of phosphosilicate glass (PSG), borosilicate glass (BSG) and SiGe.

* * * * *